(12) United States Patent
Sandquist et al.

(10) Patent No.: US 7,145,321 B2
(45) Date of Patent: Dec. 5, 2006

(54) CURRENT SENSOR WITH MAGNETIC TOROID

(76) Inventors: David A. Sandquist, 1537 Hamline Ave. N., St. Paul, MN (US) 55108; Andrzej Peczalski, 9873 Balmoral La., Eden Prairie, MN (US) 55347

( * ) Notice: Subject to any disclaimer, the term of this patent is extended or adjusted under 35 U.S.C. 154(b) by 0 days.

(21) Appl. No.: 11/066,788

(22) Filed: Feb. 25, 2005

(65) Prior Publication Data

US 2006/0192548 A1    Aug. 31, 2006

(51) Int. Cl.
   *G01R 15/18*    (2006.01)
(52) U.S. Cl. .................... 324/117 R; 324/127
(58) Field of Classification Search ............ 324/117 R, 324/126–127
   See application file for complete search history.

(56) References Cited

U.S. PATENT DOCUMENTS

| | | | | |
|---|---|---|---|---|
| 2,137,878 | A | * | 11/1938 | Kramer ...................... 324/120 |
| 2,153,378 | A | * | 4/1939 | Kramer .................. 324/117 R |
| 3,422,352 | A | * | 1/1969 | Paulkovich ................. 324/120 |
| 3,461,387 | A | | 8/1969 | Morris et al. |
| 3,500,171 | A | * | 3/1970 | Kusters et al. .............. 323/255 |
| 3,534,247 | A | * | 10/1970 | Miljanic .................... 323/357 |
| 3,768,011 | A | * | 10/1973 | Swain .................... 324/117 R |
| 3,815,013 | A | * | 6/1974 | Milkovic ................... 323/357 |
| 4,032,836 | A | * | 6/1977 | Gross .......................... 323/356 |
| 4,353,113 | A | * | 10/1982 | Billings ..................... 363/21.1 |
| 4,482,862 | A | * | 11/1984 | Leehey ................... 324/117 R |
| 4,626,777 | A | * | 12/1986 | Ainsworth ............. 324/117 R |
| 4,851,775 | A | | 7/1989 | Kim et al. |
| 5,239,264 | A | | 8/1993 | Hawks |
| 5,293,121 | A | * | 3/1994 | Estes, Jr. ................. 324/117 R |
| 5,307,008 | A | * | 4/1994 | So ............................. 323/357 |
| 5,602,464 | A | * | 2/1997 | Linkowsky et al. ........ 323/272 |
| 5,831,432 | A | | 11/1998 | Mohri |
| 5,982,175 | A | | 11/1999 | Mohri |
| 5,994,899 | A | | 11/1999 | Mohri |
| 6,084,406 | A | | 7/2000 | James et al. |
| 6,512,370 | B1 | | 1/2003 | James |
| 6,650,112 | B1 | | 11/2003 | Takayama et al. |
| 2003/0005267 | A1 | | 1/2003 | Kawase |
| 2003/0052671 | A1 | | 3/2003 | Nekado et al. |
| 2003/0151405 | A1 | | 8/2003 | Li |

FOREIGN PATENT DOCUMENTS

| | | |
|---|---|---|
| EP | 0 965 851 B1 | 8/2002 |
| EP | 1 139 069 B1 | 10/2003 |
| WO | WO 02/061445 A1 | 8/2002 |
| WO | WO 03/071299 A1 | 2/2003 |

* cited by examiner

*Primary Examiner*—Vinh Nguyen
*Assistant Examiner*—Arleen M. Vazquez
(74) *Attorney, Agent, or Firm*—Kris T. Fredrick

(57) ABSTRACT

A current sensor for sensing current in a primary source, including a primary conductor forming at least one winding on a first portion of a toroid formed from a magnetic material. A secondary source of electrical current from a signal forms a plurality of winding on a second portion of the toroid. An output reader measures the instantaneous loading of the signal passing through the plurality of windings as a function of the primary source current. The preferred toroid is formed from an amorphous core magnetic material having an hysteresis saturation point is much larger than the coercivity of the material and said primary source of electrical current is AC or DC current. The device includes an amplifier for receiving the signal and place an AC voltage or current on the plurality of windings, and further includes a resistor form measuring the resulting voltage or current instantaneous loading.

18 Claims, 3 Drawing Sheets

CURRENT SENSOR WITH MAGNETIC TOROID

FIELD OF THE INVENTION

The present invention relates to electric current sensors. More particularly, the invention relates to a sensor using a magnetic toroid with a primary conductor wrapped through the toroid as a coil and carrying the current to be measured.

BACKGROUND OF THE INVENTION

There are a number of current sensors used in industrial applications. Examples are motor control, uninterruptible power supplies, variable speed drives, welding power supplies and the like. There is a trend toward smaller size and lower cost for these current sensors. A number of designs use external magnetic fields, such as, for example, U.S. Pat. No. 3,461,387 which uses two or more coils and it is a device that detects external magnetic fields, not current. The use of a saturated magnetic core has been shown in U.S. Pat. No. 5,239,264 and creates a field current in a coil. U.S. Pat. No. 5,831,432 uses a pair of magneto-impedance elements to cancel out uniform disturbance magnetic fields such as the terrestrial field.

The use of an amorphous wire has been proposed in U.S. Pat. No. 5,994,899. The amplitude of the voltage is asymmetrically varied with a variation in an externally applied magnetic field. A similar use of asymmetrical magneto-impedance is shown in PCT publication WO 02/061445 A1, which is used as a current leakage detector.

U.S. Patent Application Publication No. US 2003/0006765 A1 discloses a sensor coil on an open core, asserting higher accuracy and miniaturization. U.S. Pat. No. 6,512,370 also uses a coil on an open core.

In traditional Hall effect and MR current sensors, the core is used to concentrate flux on a sensor and to partially shield stray fields. Because these sensors have a gap, it is not possible to completely shield external stray fields.

When the loading of coils is used to sense current, the magnitude of the impedance changes with stray field, temperature, part variation and the like. Thus it is not practical to construct a current sensor that relies on an absolute value of the impedance.

In some devices, it is necessary to have some feedback to improve accuracy. This is not a good solution, however, because an additional coil would be required to provide the feedback signal.

It would be of advantage in the art if a small, inexpensive sensor could be developed that would occupy a very small space, in the order of a 10 mm square footprint.

Yet another advantage would be if a sensor could be provided that is capable of sensing both DC and AC current.

It would be another advance in the art if a feedback coil could be provided in a current sensor without adding additional cost and bulk to the sensor.

Other advantages will appear hereinafter.

SUMMARY OF THE INVENTION

It has now been discovered that the above and other advantages of the present invention may be obtained in the following manner. Specifically, the present invention provides a current sensing device that has a rapid response time, has a high precision response, is small in size, low in cost, an other important properties.

In its simplest form the present invention comprises a toroid shaped core having two windings. The first winding contains the primary current of interest. This primary current can be DC or AC. The second winding contains an AC signal that responds such that its instantaneous loading, either as impedance or admittance, corresponds to or is a function of the first or primary current. Typically, only one winding loop is necessary for the primary current of interest. The secondary winding is a plurality of loops, preferably from at least twenty windings. Devices have been made using windings of 30 turn, 100 turns, and 400 turns. The actual number of winding turns is a design variable, depending on the cost and size limitations and the degree of sensitivity and response time needed.

The toroid is formed from a magnetic material such as an amorphous core magnetic material. Preferred is a magnetic material having an hysteresis saturation point at least 50 times larger than the coercivity of the material. One such material is Metglas® 2714, available from the Metglas Inc. It is a cobalt based, ultrahigh permeability magnetic alloy. Other materials are also useful, such as at least some forms of permalloy.

The device of this invention includes an amplifier for receiving the AC signal and placing the AC signal on the plurality of windings. A resistor measures the instantaneous loading of the signal, which is representative of the primary current in the first winding. In one embodiment, the circuit places an AC voltage on the windings, and the resistor reads the current thereby produced. In another embodiment, the circuit places an AC current on the windings, and the resistor reads the voltage thereby produced.

The output of the sensor is symmetrical for positive or negative primary current about zero, and this symmetry is constant over variations in temperature, frequency, stray fields, manufacturing variations, and part to part variations, even though the magnitude of the output my change with these conditions.

BRIEF DESCRIPTION OF THE DRAWINGS

For a more complete understanding of the invention, reference is hereby made to the drawings, in which.

DETAILED DESCRIPTION OF THE PREFERRED EMBODIMENT

The present invention provides for substantial improvements in small current measuring devices. Specifically, the device of this invention operates based on the way the magnetic properties of a toroid core change with current applied to turns off wire wrapped around the core. Applied current, called the primary current or current being sensed, generates a magnetic field that becomes trapped in the core. This magnetic field starts to saturate the core. Saturation changes the AC losses and inductance of the core. This change in core properties is detected as a change in impedance looking into a second coil wrapped around the core.

In prior art Hall effect and MR current sensors, the core is used to concentrate flux on a sensor and to partially shield stray fields. In the present invention, by looking at how the impedance, or inversely the admittance, in the core changes with applied current, the core itself becomes the sensor, resulting in a cost savings. Moreover, without a gap for a Hall effect o MR sensor, external stray fields are completely shielded. Further, a toroid without a gap removes the process step to cut a gap in the toroid, which reduces cost and complexity.

Figure 1:
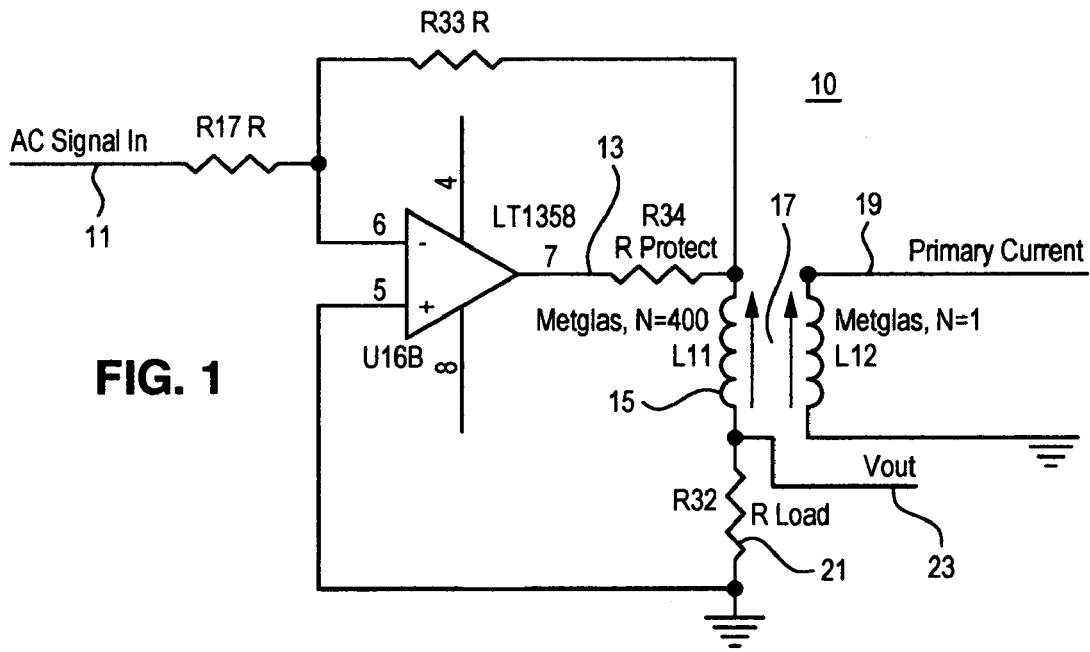
FIG. 1 is a circuit diagram showing one embodiment of the present invention.

The preferred embodiment of the present invention is shown in FIG. 1 as a circuit diagram, 10 generally. An AC signal 11 is introduced through resistor R17, and receive by amplifier LT 1358 to place an AC voltage 13 on coil 15. R 34 serves to protect the amplifier, by limiting the current drive of the amplifier U16B. Resistor R34 is placed within the op amp loop so it does not dominate the load at very high admittance changes in the coil.

Coil 15 is a plurality of windings (400 in FIG. 1) around toroid core 17, made in this example from an amorphous magnetic material such as Metglas® 2714. Other materials include permalloys, supermalloys, and other industry standard toroid material with high magnetic permeability and low coercivity. The core has very low coercivity and high permeability. The hysteresis saturation point is as high as possible and preferably more than 16 times larger than the coercivity of said material. With Metglas®, this ratio is at least 16:1 or more, and thus increases the operation margin.

Also passing through toroid core 17 is a primary current 19 which has one winding around said core 17. Current 19 is the current sought to be measured. The sensor of this invention is operable with primary currents from DC current to AC currents up to 200 Hz or more. In FIG. 1, the admittance is sensed as the voltage 13 is applied to core 17 and the current 21 is measured in resistor R32 to produce an output signal 23. For a frequency above about 40 Hz, the secondary coil will act as a transformer mirroring the current in the primary divided by the turns ration (number of turns on the secondary over the number of turns on the primary). The transformer bandwidth is limited at the lower end to about 40 Hz and at the upper end by the magnetic toroid material. Metglas material responds beyond 200 MHz. The two components give a total frequency response of DC to 200 MHz+.

Figure 2:
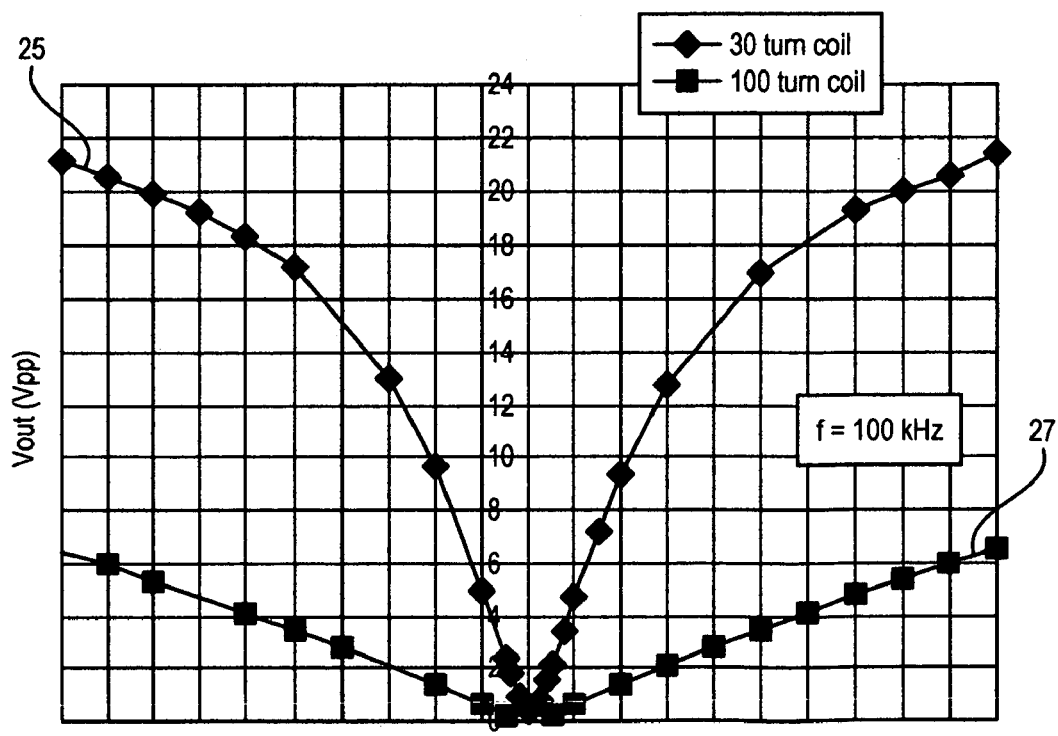
FIG. 2 is a graphical representation of the results from the device of FIG. 1, for two different windings or turns of the secondary windings on the toroid.

FIG. 2 shows the output signal 23. The admittance is zero for a primary current 19 at zero. The curves 25 and 27 represent examples where the number of turns in the secondary coil 15 is, respectively, 30 and 100. If temperature, stray fields, part variation, frequency or other environmental or manufacturing effects are changed, the magnitude or numbers of this curve may change but the symmetry remains. The curves 25 and 27 have different absolute values, but they are both symmetric about zero. The present invention utilizes the robustness of this symmetry even in adverse conditions to make a sensor that is insensitive to these effects. Thus the sensor is very accurate in addition to being low cost.

Figure 3:
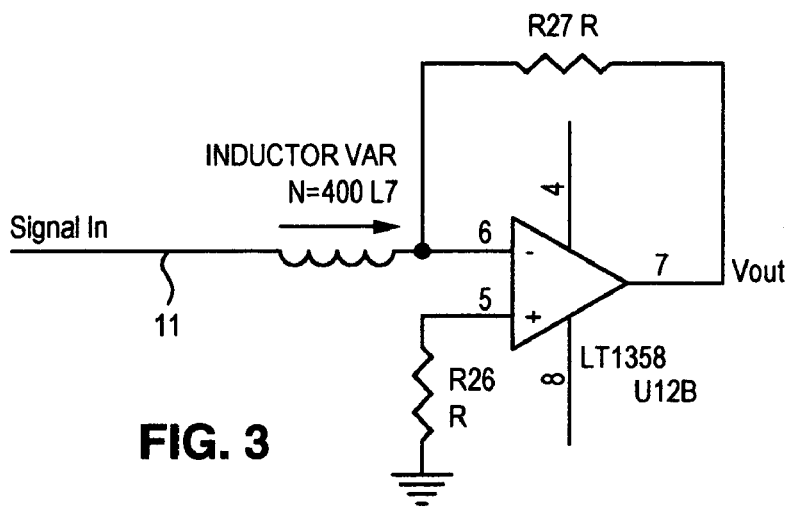
FIG. 3 is an circuit for another admittance form of the present invention.
Figure 4:
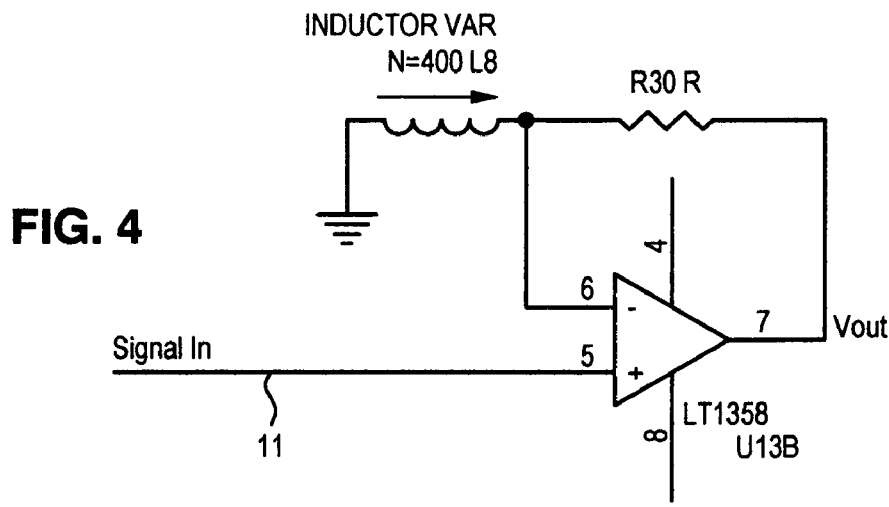
FIG. 4 is an circuit for another admittance form of the present invention.
Figure 5:
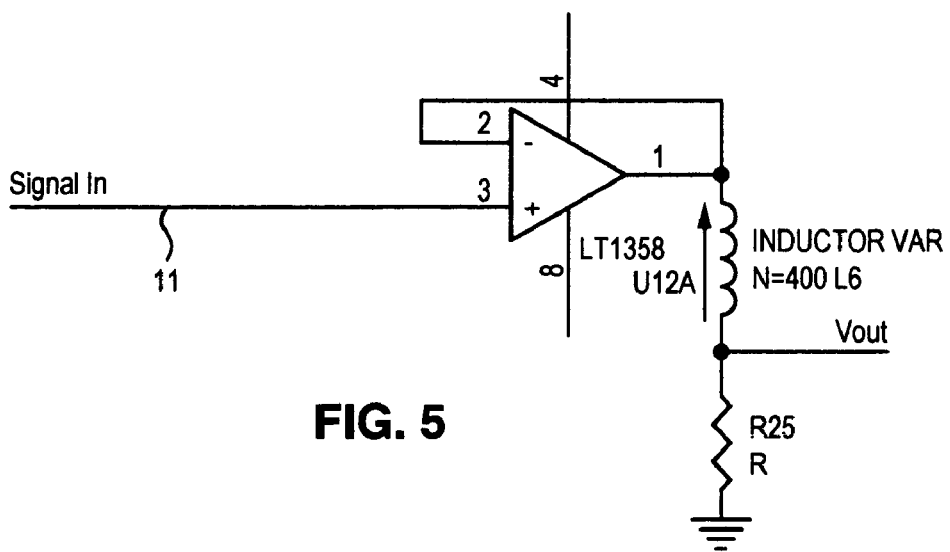
FIG. 5 is an circuit for another admittance form of the present invention.
Figure 6:
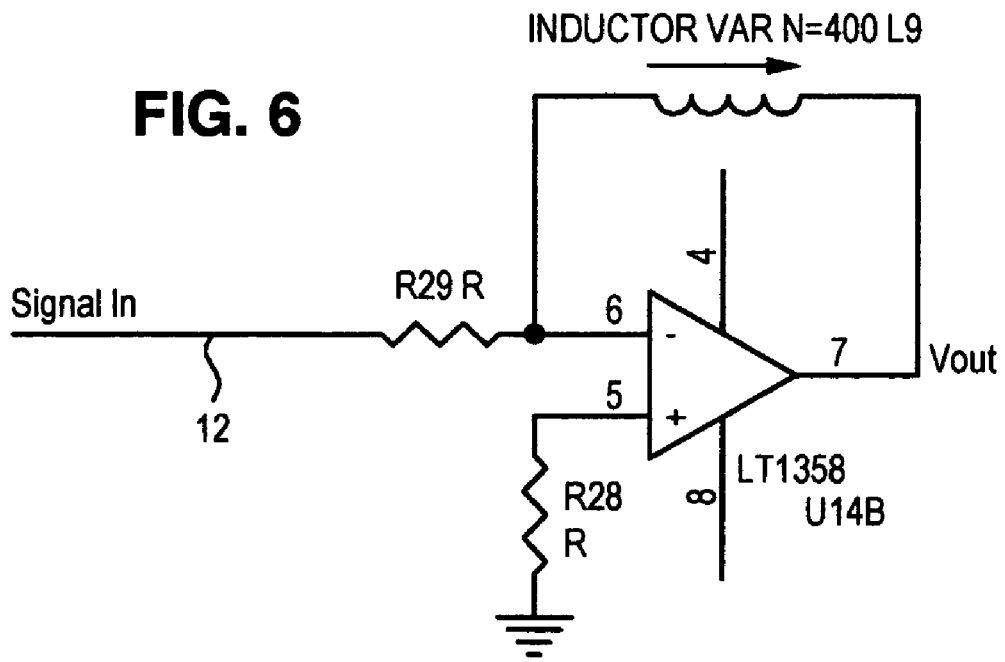
FIG. 6 is an circuit for another impedance form of the present invention.
Figure 7:
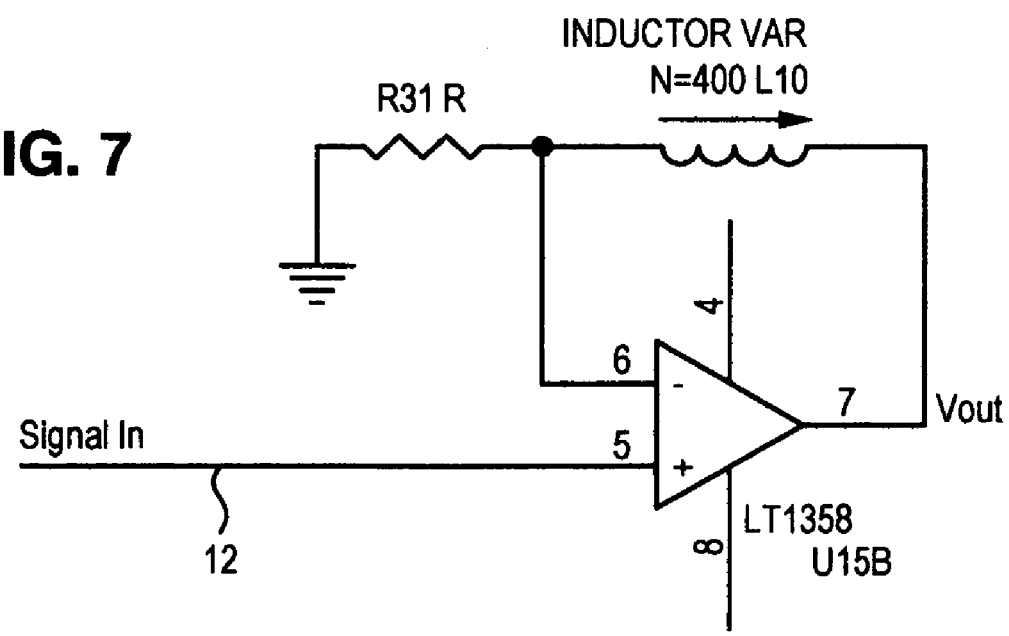
FIG. 7 is an circuit for another impedance form of the present invention.

FIGS. 3, 4 and 5 each show admittance based sensor circuits in which the in-put signal 11 is an AC current applied in different ways to the amplifier TL 1358, so that the current in the toroid, not shown in these figs., corresponds to the primary current. Similarly, FIGS. 6 and 7 each show inductor based sensor circuits in which the in-put signal 12 is an AC voltage applied to the amplifier TL 1358. The LT1358 is a model of amplifier that is commonly used and is not specifically crucial to operation. Other op-amps could be substituted as desired. The amplifier applies a current proportional to this voltage to the secondary coil. The secondary voltage across the coil corresponds to the primary current.

While particular embodiments of the present invention have been illustrated and described, it is not intended to limit the invention, except as defined by the following claims.

The invention claimed is:

1. A current sensor device for sensing electrical current in a primary source, comprising:
   a primary source of electrical current including a primary conductor carrying said primary source current;
   a toroid formed from a magnetic material, said primary conductor forming at least one winding on a first portion of said toroid; a secondary source of electrical stimulation from a signal, including a secondary conductor carrying said signal, said secondary conductor forming a plurality of winding on a second portion of said toroid;
   an amplifier for placing an AC signal on said plurality of windings to produce a resulting instantaneous loading; and
   an output reader to measure said instantaneous loading on said secondary conductor passing through said plurality of windings as a function of the magnitude and polarity of said primary source current.

2. The device of claim 1, where said toroid is formed from an amorphous core magnetic material having symmetrical magnetic and electro-magnetic properties and said primary source of electrical current is AC or DC current.

3. The device of claim 2, where said amorphous core magnetic material has an hysteresis saturation point much larger than the coercivity of said material.

4. The device of claim 1, where said plurality of windings is at least 20.

5. The device of claim 1, wherein said amplifier is adapted to place an AC voltage on said plurality of windings to produce a resulting current instantaneous loading.

6. The device of claim 1, wherein said amplifier is adapted to place an AC current on said plurality of windings to produce a resulting voltage instantaneous loading.

7. A current sensor device for sensing electrical current in a primary source, comprising:
   a primary source of electrical current including primary conductor means for carrying said primary source current;
   toroid means for providing a closed loop of a magnetic material, said primary conductor means forming at least one winding on a first portion of said toroid means;
   a secondary source of electrical stimulation from a signal, including a secondary conductor means for carrying said signal, said secondary conductor means forming a plurality of winding on a second portion of said toroid means;
   amplifier means for placing an AC signal on said plurality of windings to produce a resulting instantaneous loading; and
   output reader means to measure said instantaneous loading on said secondary conductor means passing through said plurality of windings as a function of the magnitude and polarity of said primary source current.

8. The device of claim 7, where said toroid means is formed from an amorphous core magnetic material having symmetrical magnetic and electro-magnetic properties and said primary source of electrical current is AC or DC current.

9. The device of claim 8, where said amorphous core magnetic material has an hysteresis saturation point is much larger than the coercivity of said material.

10. The device of claim 7, where said plurality of windings is at least 20.

11. The device of claim 7, wherein said amplifier means is adapted to place an AC voltage on said plurality of windings to produce a resulting current instantaneous loading.

12. The device of claim 7, wherein said amplifier means is adapted to place an AC current on said plurality of windings to produce a resulting voltage instantaneous loading.

13. A method of sensing current in a primary source, comprising:
 passing a primary source of electrical current from a primary conductor carrying said primary source current by forming at least one winding on a first portion of a toroid formed from a magnetic material;
 passing a secondary source of electrical stimulation from a signal, including a secondary conductor carrying said signal, through a plurality of winding on a second portion of said toroid;
 placing an AC signal from an amplifier on said plurality of windings to produce a resulting instantaneous loading; and
 measuring said instantaneous loading on said secondary conductor passing through said plurality of windings as a function of the magnitude and polarity of said primary source current.

14. The method of claim 13, where said toroid is formed from an amorphous core magnetic material having symmetrical magnetic and electro-magnetic properties and said primary source of electrical current is AC or DC current.

15. The method of claim 14, where said amorphous core magnetic material has an hysteresis saturation point is much larger than the coercivity of said material.

16. The method of claim 13, where said plurality of windings is at least 20.

17. The method of claim 13, wherein said amplifier places an AC voltage on said plurality of windings to produce a resulting current instantaneous loading.

18. The method of claim 13, wherein said amplifier places an AC current on said plurality of windings to produce a resulting voltage instantaneous loading.

* * * * *